(12) United States Patent
Tsuchida (10) Patent No.: US 10,750,611 B2
(45) Date of Patent: Aug. 18, 2020

(54) ELECTRODE EMBEDDED MEMBER

(71) Applicant: NGK SPARK PLUG CO., LTD., Nagoya-shi, Aichi (JP)

(72) Inventor: Atsushi Tsuchida, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/172,967

(22) Filed: Oct. 29, 2018

(65) Prior Publication Data

US 2019/0132945 A1    May 2, 2019

(30) Foreign Application Priority Data

Oct. 30, 2017 (JP) ................. 2017-209383
Sep. 21, 2018 (JP) ................. 2018-177025

(51) Int. Cl.
*H05K 1/00* (2006.01)
*H05K 1/02* (2006.01)
(Continued)

(52) U.S. Cl.
CPC ......... *H05K 1/0271* (2013.01); *H05K 1/0306* (2013.01); *H05K 3/4015* (2013.01); *H05K 2201/0379* (2013.01); *H05K 2201/0391* (2013.01); *H05K 2201/068* (2013.01); *H05K 2201/0969* (2013.01);
(Continued)

(58) Field of Classification Search
CPC .. H05K 1/00; H05K 1/02; H05K 1/03; H05K 1/11; H05K 1/16; H05K 1/18; H05K 1/19; H05K 1/20; H01L 21/67; H01L 21/683; H01L 23/12; H01L 23/13; H01L 23/48; H01L 23/498

USPC ..... 174/258, 126.2, 251; 361/118, 231, 233, 361/234, 766, 795; 438/613, 375, 393
See application file for complete search history.

(56) References Cited

U.S. PATENT DOCUMENTS 4,419,213 A * 12/1983 Oshima .............. G01N 27/4071
204/425
4,744,806 A *  5/1988 Ozolins .................. B01D 46/10
210/DIG. 5
(Continued)

FOREIGN PATENT DOCUMENTS

JP         5591627  B2     9/2014

*Primary Examiner* — Xiaoliang Chen
(74) *Attorney, Agent, or Firm* — Stites & Harbison, PLLC; Jeffrey A. Haeberlin; James R. Hayne (57) ABSTRACT

An electrode embedded member includes a plate-shaped substrate having a front surface and a back surface and that is made of a ceramic, an inner electrode extending parallel to the front surface of the substrate and that is embedded in the substrate, a connection member extending parallel to the front surface of the substrate and that is disposed so as to overlap the inner electrode, and a terminal connected to the connection member. The electrode embedded member has a predetermined structure including at least one of the following: a first predetermined structure in which a thickness of at least a part of the connection member in a direction perpendicular to the front surface of the substrate is 0.2 mm or smaller; a second predetermined structure in which the connection member includes a cutout portion; and a third predetermined structure in which the connection member is composed of a mesh structure.

3 Claims, 3 Drawing Sheets

(51) Int. Cl.

| | | |
|---|---|---|
| *H05K 1/03* | (2006.01) | |
| *H05K 1/11* | (2006.01) | |
| *H05K 1/16* | (2006.01) | |
| *H01K 1/18* | (2006.01) | |
| *H01L 21/67* | (2006.01) | |
| *H01L 23/12* | (2006.01) | |
| *H01L 23/13* | (2006.01) | |
| *H01L 23/48* | (2006.01) | |
| *H01L 23/498* | (2006.01) | |
| *H05K 3/40* | (2006.01) | |

(52) U.S. Cl.
CPC .............. *H05K 2201/09381* (2013.01); *H05K 2201/09472* (2013.01); *H05K 2201/09681* (2013.01); *H05K 2201/10318* (2013.01)

(56) References Cited

U.S. PATENT DOCUMENTS

| | | | | |
|---|---|---|---|---|
| 5,905,335 | A * | 5/1999 | Fushimi | H01J 29/028 313/495 |
| 6,130,148 | A * | 10/2000 | Farnworth | H01L 23/13 257/E23.004 |
| 6,140,761 | A * | 10/2000 | Fushimi | B82Y 10/00 313/495 |
| 6,492,599 | B1 * | 12/2002 | Sugihara | G01R 1/07314 174/255 |
| 8,971,008 | B2 * | 3/2015 | Kondo | H01L 21/6833 361/231 |
| 9,148,958 | B2 * | 9/2015 | Hiroshima | H05K 1/18 |
| 2003/0141345 | A1 * | 7/2003 | Shinkai | B23K 1/0008 228/122.1 |
| 2003/0157360 | A1 * | 8/2003 | Shinkai | B23K 20/023 428/621 |
| 2003/0219956 | A1 * | 11/2003 | Mori | H05K 1/162 438/393 |
| 2004/0022043 | A1 * | 2/2004 | Sakai | H01L 23/49822 361/795 |
| 2005/0017740 | A1 * | 1/2005 | Higashitani | H01L 21/4857 361/728 |
| 2006/0169688 | A1 * | 8/2006 | Mori | B23K 35/24 219/444.1 |
| 2007/0223167 | A1 * | 9/2007 | Hattori | C04B 35/101 361/118 |
| 2008/0116187 | A1 * | 5/2008 | Sugimoto | H01L 21/67103 219/200 |
| 2008/0289853 | A1 * | 11/2008 | Sakai | H01L 23/49822 174/126.2 |
| 2012/0188735 | A1 * | 7/2012 | Hiroshima | H05K 1/18 361/767 |
| 2014/0021027 | A1 * | 1/2014 | Stone | H03K 17/955 200/600 |
| 2016/0007447 | A1 * | 1/2016 | Funahashi | H01L 27/14618 348/375 |
| 2016/0358801 | A1 * | 12/2016 | Minami | H01L 21/67103 |
| 2016/0368829 | A1 * | 12/2016 | Minami | C04B 37/026 |

* cited by examiner

ELECTRODE EMBEDDED MEMBER

CROSS-REFERENCE TO RELATED APPLICATION

The present application claims priority to Japanese Patent Application No. 2017-209383 and 2018-177025 filed on Oct. 30, 2017, and Sep. 21, 2018, respectively, the disclosures of which are herein incorporated by reference in their entirety.

BACKGROUND OF THE INVENTION

1. Field of the Invention

The present invention relates to an electrode embedded member in which an inner electrode is embedded in a substrate made of a ceramic.

2. Description of the Related Art

To date, an electrode embedded members in which an inner electrode is embedded in a substrate made of a ceramic known (see, for example, PTL 1). In the electrode embedded member, a connection member is disposed beforehand at a portion where the inner electrode is to be connected to a terminal in order to prevent the inner electrode from being damaged when forming an insertion hole, for connecting the terminal to the inner electrode, in the substrate. The connection member prevents the inner electrode from being damaged.

PATENT LITERATURE

PTL 1 is Japanese Patent No. 5591627.

In the existing electrode embedded member, when temperature changes repeatedly during use, a crack is formed in the substrate due to the difference in thermal expansion coefficient between the substrate and the connection member, and the insulation performance of the substrate may not be maintained.

BRIEF SUMMARY OF THE INVENTION

An object of the present invention is to provide an electrode embedded member that can suppress a defect such as a crack in a substrate.

[1] To achieve the object, an electrode embedded member according to an aspect of the present invention includes a plate-shaped substrate that has a front surface and a back surface (and that is made of a ceramic; an inner electrode that extends parallel to the front surface of the substrate and that is embedded in the substrate; a connection member that extends parallel to the front surface of the substrate and that is disposed so as to overlap the inner electrode; and a terminal (that is connected to the connection member. The electrode embedded member has a predetermined structure including at least one of the following (1) to (3): (1) a first predetermined structure in which a thickness of at least a part of the connection member in a direction perpendicular to the front surface of the substrate is 0.2 mm or smaller, (2) a second predetermined structure in which the connection member defines a cutout portion, and (3) a third predetermined structure in which the connection member is composed of a mesh structure.

With the aspect of the present invention, because the connection member has one of the first to third predetermined structures, the volume of the connection member can be reduced. Therefore, a stress that is induced due to the difference in physical properties between the connection member and the base material, which is a ceramic, can be suppressed, and it is possible to suppress a defect such as a crack in an insulation layer (a part of the substrate from the inner electrode to the front surface of the substrate).

[2] In the aspect of the present invention, preferably, the predetermined structure includes at least the first predetermined structure, and, in the first predetermined structure, a thickness of an entirety of the connection member in the direction perpendicular to the front surface of the substrate is 0.2 mm or smaller. In other words, the electrode embedded member has the first predetermined structure, and a thickness of an entirety of the connection member in the direction perpendicular to the front surface of the substrate is 0.2 mm or smaller. With this structure, because the entirety of the connection member can suppress generation of an internal stress, it is possible to further suppress a defect such as a crack.

[3] In the aspect of the present invention, preferably, the predetermined structure includes at least the second predetermined structure; and the cutout portion is a slit that is not located in a central region of the connection member and that extends radially from the central region side of the connection member toward an outer edge of the connection member, the central region being a region to which the terminal is connected. In other words, the electrode embedded member has the second predetermined structure, the terminal is connected to a central region of the connection member, and the cutout portion is a slit that is not located in the central region of the connection member and that extends radially from the central region of the connection member toward an outer edge of the connection member. With this structure, because the connection member can be easily deformed due to the slit and generation of an internal stress can be suppressed, it is possible to suppress a defect such as a crack.

[4] In the aspect of the present invention, preferably, the predetermined structure includes at least the second predetermined structure; and the cutout portion is a cutout hole that is not located in a central region of the connection member and that extends through the connection member, the central region being a region to which the terminal is connected. In other words, the electrode embedded member has the second predetermined structure, the terminal is connected to a central region of the connection member, and the cutout portion is a cutout hole that is not located in the central region of the connection member and that extends through the connection member. With this structure, because the connection member can be easily deformed due to the cutout hole and generation of an internal stress can be suppressed, it is possible to suppress a defect such as a crack.

[5] In the aspect of the present invention, preferably, the predetermined structure includes at least the second predetermined structure; and the cutout portion is not located in a central region of the connection member and extends from the central region side to reach an outer edge of the connection member, the central region being a region to which the terminal is connected. In other words, the electrode embedded member has the second predetermined structure, the terminal is connected to a central region of the connection member, and the cutout portion is not located in a central region of the connection member and extends from the central region of the connection member to reach an outer edge of the connection member. With this structure, because the connection member can be easily deformed due to the cutout hole and generation of an internal stress can be suppressed, it is possible to further suppress a defect such as a crack.

[6] In the aspect of the present invention, preferably, the predetermined structure includes at least the third predetermined structure, and the connection member is composed of a plurality of the mesh structures that are stacked. In other words, the electrode embedded member has the third predetermined structure, and the connection member is composed of a plurality of the mesh structures that are stacked. With this structure, because the connection member, which is a mesh structure, can be easily deformed and generation of internal stress can be suppressed, it is possible to further suppress a defect such as a crack. By stacking a plurality of mesh structures, it is possible to provide sufficiently high strength to the connection member.

[7] In the aspect of the present invention, preferably, the predetermined structure has rotational symmetry when seen in the direction perpendicular to the front surface of the substrate. In other words, the electrode embedded member has rotational symmetry when seen in the direction perpendicular to the front surface of the substrate. With this structure, because the connection member has rotational symmetry, compared with a case where the connection member does not have rotational symmetry, it is possible to reduce overlapping of paths for releasing an internal stress that is generated due to deformation of the connection member, to appropriately disperse the internal stress in the connection member, and to suppress formation of a crack in a part of the insulation layer near the front surface of the substrate.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

A. First Embodiment

Figure 1:
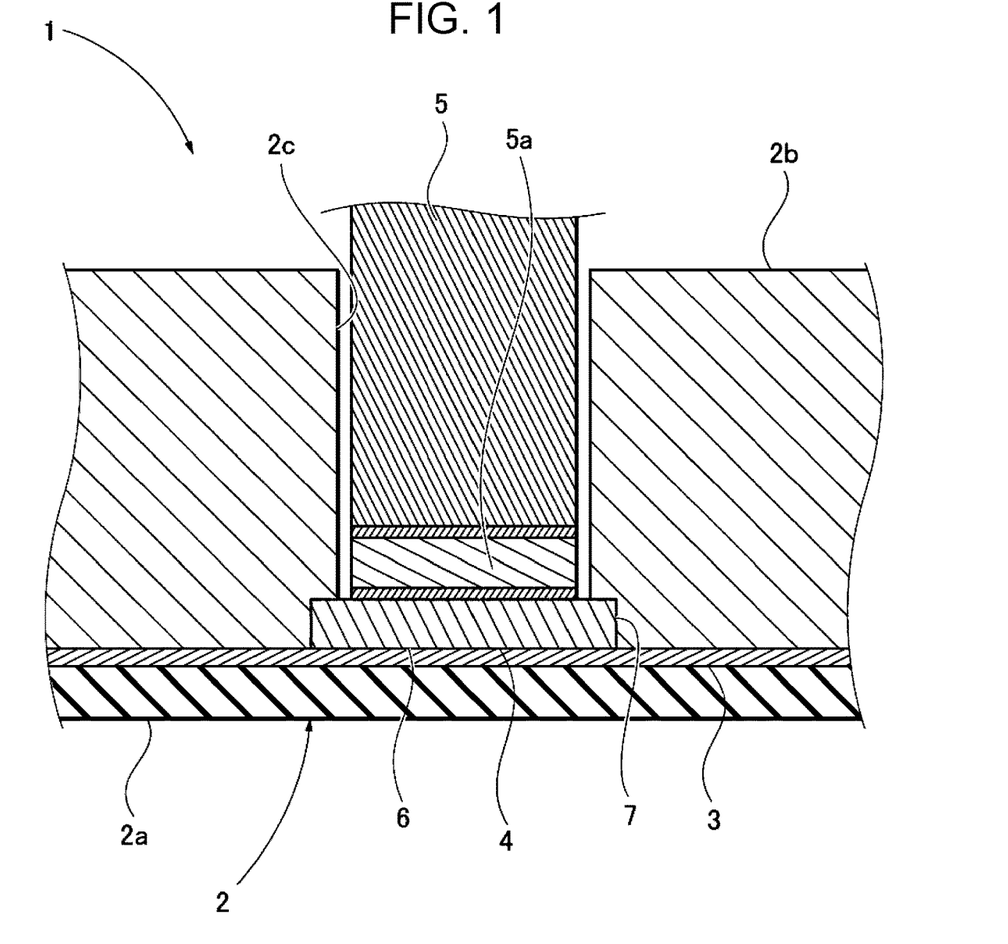
FIG. 1 schematically illustrates an electrode embedded member according to a first embodiment.

As schematically illustrated in FIG. 1, an electrode embedded member 1 according to a first embodiment includes a disk-shaped substrate 2 that has a front surface 2a and a back surface 2b, a strip-shaped inner electrode 3 that extends parallel to the front surface 2a of the substrate 2 and that is embedded in the substrate 2, a disk-shaped connection member 4 that extends parallel to the front surface 2a of the substrate 2 and that is disposed so as to overlap the inner electrode 3. The substrate 2 is made of a ceramic such as aluminum oxide ($Al_2O_3$), aluminum nitride (AlN), silicon carbide (SiC), silicon nitride ($Si_3N_4$), zirconium oxide ($ZrO_2$), or barium titanate ($BaTiO_3$). A bar-shaped terminal 5 is joined to the connection member 4 by brazing or the like.

The inner electrode 3 and the connection member 4 are each made of tungsten, molybdenum, or an alloy that includes one of these as a main component. The terminal 5 is made of nickel, titanium, copper, or an alloy that includes one of these as a main component.

Figure 2:
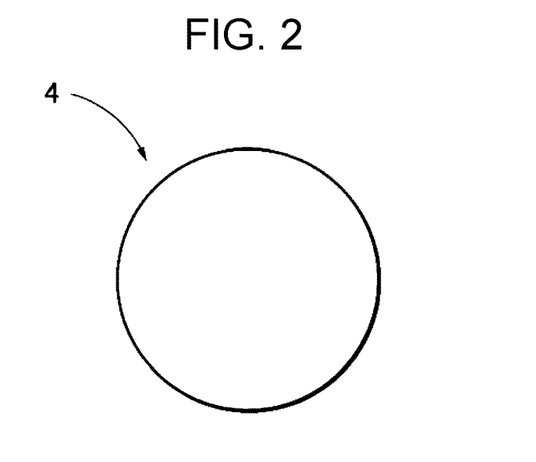
FIG. 2 illustrates a connection member according to the first embodiment.

As illustrated in FIG. 2, the connection member 4 is disk-shaped. The thickness of the entirety of the connection member 4 in the direction perpendicular to the front surface of the substrate 2 is 0.2 mm or smaller. In the first embodiment, the structure in which the thickness of the entirety of the connection member 4 in the direction perpendicular to the front surface of the substrate 2 of 0.2 mm or smaller corresponds to a first predetermined structure in the present invention. The connection member 4 only needs to mitigate an effect of thermal expansion to a certain degree by being deformed. As long as the connection member 4 can absorb an effect of thermal expansion by being deformed, the thickness of only a part of the connection member 4 in the direction perpendicular to the front surface of the substrate 2 may be 0.2 mm or smaller.

With the electrode embedded member 1 according to the first embodiment, the volume of the connection member 4 can be reduced, compared with a case where the thickness of a connection member in the direction perpendicular to the front surface of the substrate 2 is larger than 0.2 mm. Therefore, even if the electrode embedded member 1 is comparatively thin, a stress that is induced due to the difference in physical properties between the connection member 4 made of a metal and the base material, which is a ceramic, is suppressed, and it is possible to further suppress a defect such as a crack in an insulation layer (a part of the substrate 2 from the inner electrode 3 to the front surface 2a of the substrate 2).

EXAMPLES AND COMPARATIVE EXAMPLES

Example 1

Next, Examples 1-1 to 1-6 (hereinafter, referred to as Example 1) of the first embodiment will be compared with comparative examples 1-1 to 1-3. In Example 1, an electrode embedded member 1, which was a wafer holding device, was manufactured from a substrate in which the inner electrode 3 was embedded. The substrate was made of aluminum nitride to which yttrium oxide was added, and the inner electrode 3 was made of a metal.

Next, a method of manufacturing an electrode embedded member 1 of Example 1 will be described. First, an insulation layer was formed. A powder mixture composed of 97% by mass of aluminum nitride powder and 3% by mass of yttrium oxide powder was obtained, a die was filled with the powder mixture, and the powder mixture was uniaxially pressed. Thus, a first layer having a diameter of 340 mm and a thickness of 5 mm was formed.

Next, the inner electrode 3 was set. On the first layer, a molybdenum foil (thickness 0.1 mm) having a diameter of 290 mm, which was to become the inner electrode 3, was placed. On the inner electrode 3, disk-shaped connection members 4, each of which was made of tungsten and had a diameter of 6 mm, were placed. Twenty connection members 4 was placed on one substrate 2. When connecting the connection members 4 to the inner electrode 3, an electro-conductive material such as tungsten paste was applied to parts of the inner electrode 3 on which the connection members 4 were to be superposed.

Next, a second layer was formed. Ceramic powder was applied onto the first layer so as to completely cover the inner electrode 3 and the connection members 4, and uniaxial pressing was performed to obtain a compact having the second layer.

Next, a heater electrode was set. A heat-generating resistor element, which was composed of a molybdenum mesh (having a wire diameter of 0.1 mm and 50 meshes per inch) formed in a predetermined pattern in order to heat the electrode embedded member 1 as a wafer holding device, was disposed. Then, at a position where a predetermined heating terminal was to be connected, a heater terminal connection member (tungsten pellet having a diameter of 10 mm and a thickness 0.5 mm) was placed.

Next, a compact before being fired was formed. A third layer was formed by applying ceramic powder onto the heater electrode and by performing uniaxial pressing.

Next, a firing step was performed. In the firing step, the stacked body in which first to third layers had been stacked was hot-press fired at a pressure of 10 MPa and a firing temperature of 1800° C. for 2 hours to obtain a ceramic sintered compact having a diameter of 340 mm and a thickness of 20 mm.

Next, a machining step after firing was performed. In the machining step after firing, by grinding and polishing the outer surface of the ceramic sintered compact, a wafer placement surface (front surface 2*a*) having a surface roughness Ra of 0.4 μm and including an insulation layer having a thickness of 0.3 mm was formed.

Next, a terminal 5 was connected. A hole (having a diameter of 5.2 mm) was formed in the ceramic base body after being fired from the back surface 2*b* to reach each connection member 4, thereby forming a cylindrical insertion hole 2*c* extending from the back surface 2*b* to reach the connection members 4. On the connection member 4 that defines the insertion hole 2*c*, a buffer member 5*a*, having a diameter of 5 mm and a thickness of 2 mm and made of Kovar, was placed via a brazing alloy that was composed of an Au—Ni alloy to which Ti was added as an active metal. Next, on the buffer member 5*a*, the terminal 5, having a diameter of 5 mm and a length of 200 mm and made of nickel, was placed via a brazing alloy that was composed of an Au—Ni alloy to which Ti was added as an active metal. Subsequently, brazing was performed by performing heating in a vacuum tunnel kiln at 1050° C., thereby completing the electrode embedded member 1.

The thickness of the connection member 4 was as follows: 0.08 mm in Example 1-1, 0.10 mm in Example 1-2, 0.13 mm in Example 1-3, 0.15 mm in Example 1-4, 0.18 mm in Example 1-5, and 0.20 mm in Example 1-6.

As the evaluation method, a heat cycle of heating the electrode embedded member 1 to 700° C. and then cooling the electrode embedded member 1 to 100° C. was repeated 30 times. The number of positions where cracks were formed on the front surface 2*a* side of the substrate 2 directly above the terminal 5 was counted. An electrode embedded member in which zero cracks were formed for 20 pieces of connection members 4 was evaluated as "good", and an electrode embedded member in which one or more cracks were formed was evaluated as "bad".

As a result, it was found that the number of positions where cracks were formed was zero in each of Examples 1-1 to 1-6 and the reliability of Examples 1-1 to 1-6 was high.

Comparative Examples

Comparative example 1-1 and comparative example 1-2 were produced under the same conditions as Example 1, except that the connection members thereof were disk-shaped and the entireties of the connection members respectively had a thickness of 0.3 mm and a thickness of 0.5 mm.

As a result, in comparative example 1-1 and comparative example 1-2, one crack and four cracks were respectively formed, indicating that the reliability was low and the evaluation was "bad" when the thickness of the connection member was 0.3 mm or larger.

In comparative example 1-3, the connection member was not used. Due to the lack of connection member, when forming a hole for the terminal, the hole tended to penetrate through the inner electrode. This posed a problem before performing the evaluation, and the production yield declined.

Values, such as diameters, in the first embodiment are examples. The values are not limited these examples, and the advantageous effects of the present invention can be obtained even when other values are set.

B. Second Embodiment

Figure 3:
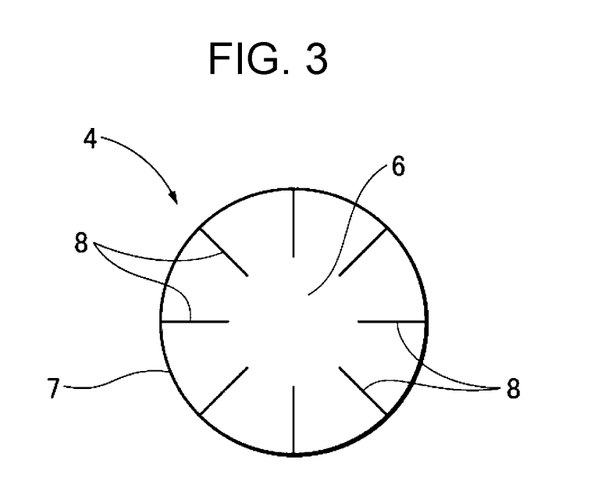
FIG. 3 illustrates a connection member according to a second embodiment.

An electrode embedded member 1 according to a second embodiment is the same as that according to the first embodiment, except that the connection member 4 differs. As illustrated in FIG. 3, in the connection member 4 according to the second embodiment, eight slits 8 (cutout portions), which are not located in a central region 6 to which the terminal 5 is connected and which extend radially from the central region 6 side toward the outer edge 7, are arranged at regular intervals in the circumferential direction. The slits 8 reach the outer edge 7. The connection member 4 has the eight slits 8 that are arranged at regular intervals in the circumferential direction, and has rotational symmetry when seen in the direction perpendicular to the front surface of the substrate 2.

With the electrode embedded member 1 according to the second embodiment, the volume of the connection member 4 can be reduced, compared with a case where the slits 8 are not formed. Therefore, a stress that is induced due to the difference in physical properties between the connection member 4 made of a metal and the base material, which is a ceramic, is suppressed, and it is possible to suppress a defect such as a crack in an insulation layer (a part of the substrate 2 from the inner electrode 3 to the front surface 2*a* of the substrate 2).

Moreover, because the connection member 4 can be easily deformed when firing the substrate 2, the internal stress of the connection member 4 is reduced. Furthermore, because the ceramic material of the substrate 2 penetrates into the slits 8 of the connection member 4, adhesion between the connection member 4 and the substrate 2 is improved, and the strength reliability of a portion near the connection member 4 is improved. In the second embodiment, the slits 8 correspond to a second predetermined structure in the present invention.

Moreover, because the connection member 4 has rotational symmetry, for example, compared with a case where the slits 8 are not arranged at regular intervals and the connection member 4 does not have rotational symmetry, it is possible to reduce overlapping of paths for releasing the internal stress, to appropriately disperse the internal stress, and to suppress formation of a crack in a part of the insulation layer near the front surface of the substrate.

In the second embodiment, each of the slits 8 reaches the outer edge 7 of the connection member 4. However, a slit in the present invention is not limited to this. For example, each of the slits may be formed so as to be cut to a position at a distance from the outer edge without reaching the outer edge of the connection member 4.

At least a part of the connection member 4 according to the second embodiment may have a thickness of 0.2 mm or smaller in the direction perpendicular to the front surface of the substrate 2, so that the connection member has both of the first predetermined structure and the second predetermined structure.

Although the ability in suppressing an internal stress may decrease, even when the arrangement of the slits 8 does not have rotational symmetry when seen in the direction perpendicular to the front surface of the substrate 2, it is possible to suppress the internal stress compared with existing structure and to obtain the advantageous effect of the present invention in suppressing a defect such as a crack.

Example 2

In Example 2 of the second embodiment, slits 8 were radially formed in the connection member 4 by laser processing so as to each have a length of 2 mm and a width of 0.1 mm. In other respects, Example 2 was the same as Example 1. Evaluation of Example 2 was performed in the same way as in Example 1. Cracks were not formed, and it was confirmed that the reliability was high.

Moreover, it is considered that, because the ceramic base material penetrated into the slits 8 of the connection member 4, adhesion between the connection member 4 and the substrate 2 made of a ceramic was improved, and the strength reliability of a portion near the connection member 4 was improved.

Values, such as diameters, in the second embodiment are examples. The values are not limited these examples, and the advantageous effects of the present invention can be obtained even when other values are set.

C. Third Embodiment

Figure 4:
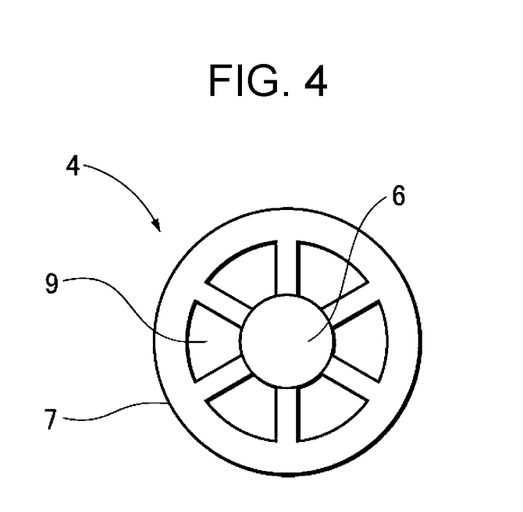
FIG. 4 illustrates a connection member according to a third embodiment.

An electrode embedded member 1 according to a third embodiment is the same as that according to the first embodiment, except that the connection member 4 differs. As illustrated in FIG. 4, in the connection member 4 according to the third embodiment, fan-shaped six cutout holes 9, which are not located in a central region 6 to which the terminal 5 is connected and which extend through the connection member 4, are arranged at regular intervals in the circumferential direction. The fan-shaped cutout holes 9 are each formed at a distance from the outer edge 7 of the connection member 4. The connection member 4 has the six cutout holes 9 that are arranged at regular intervals in the circumferential direction, and has rotational symmetry when seen in the direction perpendicular to the front surface of the substrate 2.

With the electrode embedded member 1 according to the third embodiment, the volume of the connection member 4 can be reduced, compared with a case where the cutout holes 9 are not formed. Therefore, a stress that is induced due to the difference in physical properties between the connection member 4 made of a metal and the base material, which is a ceramic, is suppressed, and it is possible to suppress a defect such as a crack in an insulation layer (a part of the substrate 2 from the inner electrode 3 to the front surface 2*a* of the substrate 2).

Moreover, because the connection member 4 can be easily deformed when firing the substrate 2, the internal stress of the connection member 4 is reduced. Furthermore, because the ceramic material of the substrate 2 penetrates into the cutout holes 9 of the connection member 4, adhesion between the connection member 4 and the substrate 2 is improved, and the strength reliability of a portion near the connection member 4 is improved. In the third embodiment, the cutout holes 9 correspond to a second predetermined structure in the present invention.

Moreover, because the connection member 4 has rotational symmetry, for example, compared with a case where the cutout holes 9 are not arranged at regular intervals in the circumferential direction or the cutout holes 9 differ from each other in size or shape so that the connection member 4 does not have rotational symmetry when seen in the direction perpendicular to the front surface of the substrate 2, it is possible to reduce overlapping of paths for releasing the internal stress and to appropriately suppress the internal stress.

In the third embodiment, six cutout holes 9 are arranged in a fan shape. However, a cutout hole in the present invention is not limited to this. For example, a cutout hole may have a shape other than a fan shape, such as a circular shape or a polygonal shape. The number of the cutout holes is not limited to six, and may be one, two to five, or seven or more.

Although the ability in suppressing an internal stress may decrease, even when the cutout holes 9 are formed in such a way that the connection member 4 does not have rotational symmetry, it is possible to suppress an internal stress compared with the existing structure and to obtain the advantageous effect of the present invention in suppressing a defect such as a crack.

Example 3

In Example 3 of the third embodiment, cutout holes 9 were formed in the connection member 4 by laser processing. Each of the cutout holes 9 had a fan shape having an inside diameter in the radial direction of 1 mm and having an outside diameter of 2.4 mm, and the intervals between the cutout holes 9 in the circumferential direction was 0.4 mm. Evaluation of Example 3 was performed in the same way as for Example 1. Cracks were not formed, and it was confirmed that the reliability was high.

Furthermore, it is considered that, because the ceramic base material penetrated into the cutout holes 9 of the connection member 4, adhesion between the connection member 4 and the substrate 2 made of a ceramic was increased, and the strength reliability of a portion near the connection member 4 was improved.

Moreover, it is considered that, also because the connection member 4 could be easily deformed when firing the ceramic material and the internal stress of the connection member 4 was reduced, the strength reliability of a portion near the connection member 4 of the electrode embedded member 1 was improved.

Values, such as diameters, in the third embodiment are examples. The values are not limited these examples, and the advantageous effects of the present invention can be obtained even when other values are set.

D. Fourth Embodiment

Figure 5:
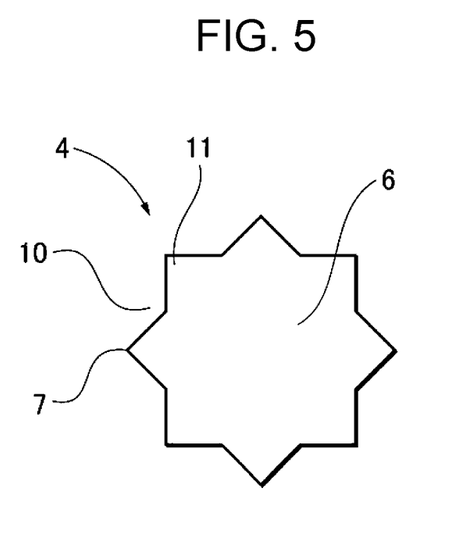
FIG. 5 illustrates a connection member according to a fourth embodiment.

An electrode embedded member 1 according to a fourth embodiment is the same as that according to the first embodiment, except that the connection member 4 differs. As illustrated in FIG. 5, in the connection member 4 according to the fourth embodiment, eight triangular cutout holes 10, which are not located in a central region 6 to which the terminal 5 is connected and which extend through the connection member 4, are arranged at intervals in the circumferential direction. The cutout holes 10 reach the outer edge 7 of the connection member 4.

With the electrode embedded member 1 according to the fourth embodiment, the volume of the connection member 4 can be reduced compared with a case where the cutout holes 10 are not formed. Therefore, a stress that is induced due to the difference in physical properties between the connection member 4 made of a metal and the base material, which is a ceramic, can be suppressed, and it is possible to suppress a defect such as a crack in an insulation layer (a part of the substrate 2 from the inner electrode 3 to the front surface 2a of the substrate 2).

Moreover, because the connection member 4 can be easily deformed when firing the substrate 2 due to the presence of the cutout holes 10, the internal stress of the connection member 4 is reduced. Furthermore, the ceramic material of the substrate 2 penetrates into the cutout holes 10 of the connection member 4. Because the cutout holes 10 reach the outer edge 7 of the connection member 4, the practical length of the outer edge of the connection member 4 is large. Therefore, adhesion between the connection member 4 and the substrate 2 is improved, and the strength reliability of a portion near the connection member 4 is improved. In the fourth embodiment, the cutout holes 10 correspond to a second predetermined structure in the present invention.

Moreover, because the connection member 4 has rotational symmetry, for example, compared with a case where the cutout holes 10 are not arranged at regular intervals in the circumferential direction or the cutout holes 10 differ from each other in size or shape so that the connection member 4 does not have rotational symmetry, it is possible to reduce overlapping of paths for releasing the internal stress of the connection member 4, to appropriately disperse the internal stress, and to suppress formation of a crack in a part of the insulation layer near the front surface of the substrate.

Although the ability in suppressing an internal stress may decrease, even when the cutout holes 10 are formed so that the connection member 4 does not have rotational symmetry, it is possible to suppress the internal stress compared with existing structure and to obtain the advantageous effect of the present invention in suppressing a defect such as a crack.

Example 4

In Example 4 of the fourth embodiment, eight cutout holes 10 were formed in the connection member 4 by laser processing at intervals of 45° in the circumferential direction. Each of protrusions 11 was formed between cutout holes 10 that are adjacent to each other in the circumferential direction so that the vertex angle was 90° and the distance from the center of the connection member 4 to the vertex of the protrusion 11 was 4 mm (that is, so that the connection member 4 had a diameter of 8 mm).

Angles and other values in the fourth embodiment are examples. The present invention is not limited to these, and the advantageous effects of the present invention can be obtained even when other values are set.

E. Fifth Embodiment

Figure 6:
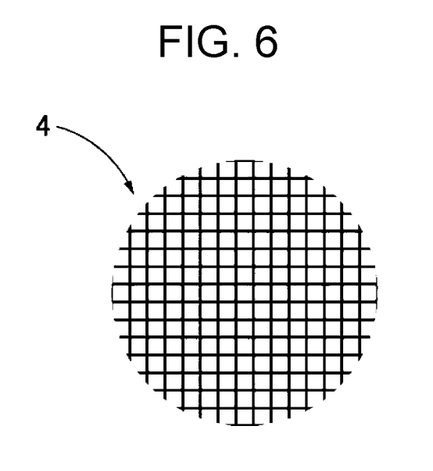
FIG. 6 schematically illustrates a connection member according to a fifth embodiment.

An electrode embedded member 1 according to a fifth embodiment is the same as that according to the first embodiment, except that the connection member 4 differs. As schematically illustrated in FIG. 6, the connection member 4 according to the fifth embodiment is composed of a mesh structure or a stack of mesh structures. Each mesh structure is formed by, for example, twisting together metal wires or metal fibers.

With the electrode embedded member 1 according to the fifth embodiment, the volume of the connection member 4 can be reduced, compared with a case where the connection member 4 is not a mesh structure. Therefore, a stress that is induced due to the difference in physical properties between the connection member 4 made of a metal and the base material, which is a ceramic, is suppressed, and it is possible to suppress a defect such as a crack in an insulation layer (a part of the substrate 2 from the inner electrode 3 to the front surface 2a of the substrate 2).

Moreover, because the connection member 4, which is a mesh structure, can be easily deformed when firing the substrate 2, the internal stress of the connection member 4 is reduced. Furthermore, because the ceramic material of the substrate 2 penetrates into the gaps in the mesh structure of the connection member 4, adhesion between the connection member 4 and the substrate 2 is improved, and the strength reliability of a portion near the terminal 5 is improved. In the fifth embodiment, the stack of mesh structures of the connection member 4 corresponds to a third predetermined structure in the present invention.

Example 5

In each of Examples 5-1 to 5-4 (hereinafter, referred to as Example 5) of the fifth embodiment, the connection member 4 was made by cutting a molybdenum mesh structure into a circular shape having a diameter of 6 mm. In other respects, Example 5 was the same as Example 1. In Example 5-1, the wire diameter was 0.03 mm, and the plain weave mesh size (the number of wires per inch) was 150. In Example 5-2, the wire diameter was 0.05 mm, and the plain weave mesh size (the number of wires per inch) was 100. In Example 5-3, the wire diameter was 0.10 mm, and the plain weave mesh size (the number of wires per inch) was 50. In Example 5-4, the wire diameter was 0.15 mm, and the plain weave mesh size (the number of wires per inch) was 40.

Example 5 was tested by using the same evaluation method as Example 1. As a result, the number of positions where cracks were formed was zero in each of Example 5-1 to Example 5-4, and it was confirmed that the reliability of Example 5 was high. It is considered that the connection member 4 composed of a mesh structure was deformed during firing of the ceramic material and the internal stress was reduced.

Moreover, it is considered that, because the ceramic material of the substrate 2 penetrated into the gaps in the mesh structure, adhesion between the connection member 4 and the substrate 2 was improved, and the strength reliability of a portion near the connection member 4 was improved.

Example 6

In Example 6-1 to Example 6-3 (hereinafter, referred to as Example 6) of the fifth embodiment, the connection member 4 had a three-layer structure in which threes mesh structures were stacked. In other respects, Example 6 was the same as Example 1.

In Example 6-1, the wire diameter was 0.03 mm, and the plain weave mesh size (the number of wires per inch) was 150. In Example 6-2, the wire diameter was 0.05 mm, and the plain weave mesh size (the number of wires per inch)

was 100. In Example 6-3, the wire diameter was 0.10 mm, and the plain weave mesh size (the number of wires per inch) was 50.

Example 6 was tested in by using the same evaluation method as Example 1. As a result, the number of positions where cracks were formed was zero in each of Example 6-1 to Example 6-3, and it was confirmed that the reliability of Example 6 was high. It is considered that the connection member 4 composed of a mesh structure was deformed during firing of the ceramic material and the internal stress was reduced.

Moreover, it is considered that, because the ceramic material of the substrate 2 penetrated into the gaps in the mesh structure, adhesion between the connection member 4 and the substrate 2 was improved, and the strength reliability of a portion near the connection member 4 was improved.

Furthermore, because the mesh structure has a three-layer structure in Example 6, it is possible to reduce the probability of penetrating through the connection member 4 and damaging the inner electrode 3 when forming the insertion hole 2c.

Furthermore, by applying a tungsten paste to interfaces between the plurality of mesh structures when stacking the mesh structures, it is possible to improve the electrical characteristics of the connection member 4.

Values, such as wire diameter, mesh size, and the number of mesh structures that are stacked in the fifth embodiment are examples. The values are not limited these examples, and the advantageous effects of the present invention can be obtained even when other values are set.

What is claimed is:

1. An electrode embedded member comprising:
   a plate-shaped substrate having a front surface and a back surface, the substrate made of a ceramic;
   an inner electrode embedded in the substrate, the inner electrode extending parallel to the front surface of the substrate;
   a connection member embedded in the substrate and disposed so as to directly connect to the inner electrode, the connection member extending parallel to the front surface of the substrate; and
   a terminal connected to the connection member,
   wherein the inner electrode is made of metal, and
   wherein the electrode embedded member has a predetermined structure in which the connection member is composed of a mesh structure.

2. The electrode embedded member according to claim 1, wherein the connection member is composed of a plurality of the mesh structures that are stacked.

3. The electrode embedded member according to claim 1, wherein the electrode embedded member has rotational symmetry when seen in the direction perpendicular to the front surface of the substrate.

* * * * *